United States Patent [19]

Ono et al.

[11] Patent Number: 4,801,997
[45] Date of Patent: Jan. 31, 1989

[54] HIGH PACKING DENSITY LEAD FRAME AND INTEGRATED CIRCUIT

[75] Inventors: Michio Ono, Tokyo; Akihiro Kubota, Kawasaki; Tsuyoshi Aoki, Kawasaki; Osamu Inoue, Kawasaki; Rikio Sugiura, Sagamihara, all of Japan

[73] Assignee: Fujitsu Limited, Kawasaki, Japan

[21] Appl. No.: 185,301

[22] Filed: Apr. 19, 1988

Related U.S. Application Data

[63] Continuation of Ser. No. 579,714, Feb. 13, 1984, abandoned, which is a continuation of Ser. No. 890,962, Jul. 29, 1986, abandoned.

[30] Foreign Application Priority Data

Feb. 12, 1983 [JP] Japan ................................. 58-20549

[51] Int. Cl.[4] .................. H01L 23/48; H01L 29/44; H01L 29/52; H01L 29/60
[52] U.S. Cl. ............................ 357/70; 357/72; 174/52.4
[58] Field of Search ..................... 357/68, 70, 72; 174/52 FP

[56] References Cited

U.S. PATENT DOCUMENTS

| | | | |
|---|---|---|---|
| 4,066,839 | 1/1978 | Cossata et al. | 174/52 FP |
| 4,138,691 | 2/1979 | Bonkohara et al. | 357/68 |
| 4,331,740 | 5/1982 | Burns | 357/70 |
| 4,441,118 | 4/1984 | Fister et al. | 174/52 FP |

FOREIGN PATENT DOCUMENTS

54-136179 10/1979 Japan .................................. 357/70

Primary Examiner—J. Carroll
Attorney, Agent, or Firm—Staas & Halsey

[57] ABSTRACT

Lead frame for mounting a semiconductor chip and improving the packing density of devices such as a plastic chip carrier type IC is disclosed. A portion of inner leads, located parallel to the chip stage and the edge of a molded case is made as thin as possible and held by inner lead supporting bars to tie bars until the molding process is finished. After molding process is finished, these bars supporting the leads and stage are cut away. Packing density is improved an amount ranging from 20% to 30%.

9 Claims, 6 Drawing Sheets

HIGH PACKING DENSITY LEAD FRAME AND INTEGRATED CIRCUIT

This is a continuation of co-pending application Ser. No. 579,714 filed on Feb. 13, 1984, abandoned, which is a continuation of co-pending application Ser. No. 890,962 filed on 7/29/86, abandoned.

BACKGROUND OF THE INVENTION

The present invention relates to a lead frame for an integrated circuit (hereinafter "IC") especially for a molded type IC package. More particularly, the present invention relates to a lead frame for an IC which enables the width of an inner lead wire to be as fine as possible, so that the packing density of the IC can be increased. The invention is applicable to plastic IC packages and the like.

A lead frame for an IC comprises a stage on which an IC die or chip (hereinafter "chip") is mounted, and lead pins are wired to the chip for connecting the chip to external circuits. The stage and lead pins are fixed to each other and held in position by stage bars and tie bars respectively, and also fixed to an outer frame. Lead frames are generally made in long strips by punching out a pattern from a metal ribbon or a roll of sheet metal.

An IC chip is usually mounted on the stage of a lead frame and bonding pads, formed on the chip, are electrically connected with bonding wires to corresponding tips of the lead frame, the other end of the lead frame corresponding to lead pins of the IC. The combination is then molded in a plastic material and separated from the roll of lead frames by cutting off the lead pins from the lead frame (i.e., from the tie bars) and consequently from the outer frame. Shaping the lead pins that project out of the molded case finishes a mold type semiconductor device.

The portion of the lead frame that is encapsulated in the molded case is called an inner lead, and the portion that projects out of the molded case is called an outer lead or lead pin.

Today, the trend is to package larger and more complex chips in standard size packages; thus, increasing the packing density of the ICs. The ratio of the chip area or stage area to the total area occupied by the IC package is defined as the packing density factor. Accordingly, a high packing density factor indicates packages occupying a smaller area than packages having a small packing density factor.

To increase the packing density factor, it is necessary to reduce the area occupied by the inner leads. However, as will be described later, the width of the inner leads has a practical lower limit, thus making it difficult to increase the packing density factor by narrowing the inner leads. Moreover, because the bonding pads of chips tend to be arranged along opposing sides of the chip, and because the outer leads must be positioned along the sides of the IC package and aligned perpendicular to the plane of the chips, the inner leads must be bent and formed into complicated shapes. This decreases the packing density factor. Because of the trend toward larger and more complicated chips, the limits associated with conventional packaging techniques have become a serious problem.

SUMMARY OF THE INVENTION

It is an object of the present invention to provide a lead frame having an improved packing density factor.

Another object of the present invention is to provide a semiconductor device having an improved packing density factor.

A further object of the present invention is to provide a semiconductor device capable of housing a chip having a standard number of lead pins in a smaller than standard package.

Still another object of the present invention is to provide an improved method of fabricating a high packing density factor semiconductor device employing a high packing density lead frame.

Still a further object of the present invention is to provide a low cost method of fabricating a high packing density factor semiconductor device.

The foregoing objects of the present invention are accomplished by a semiconductor device including a lead frame having an intermediate portion positioned between a stage and an outer frame, and positioned in parallel with an edge of the stage, and having a width being almost near the minimum workable size defined by conventional punching technology.

Because the intermediate portion is so narrow, it is easily bent during the bonding and molding processes. To avoid this bending, appropriate inner leads are bridged to the outer frame with supporting bars. Thus, the inner leads are held in position and are free from being deformed during the process of fabricating the IC. The bridges are cut off together with the outer frame after the molding process.

By using such a lead frame, it is possible to provide a seminconductor device capable of housing a chip having a standard number of lead pins in a package being smaller than the package normally associated with the number of lead pins.

These and other objects and advantages of the present invention will be apparent from the detailed description of the construction and operation of the present invention, together with the claims. In the following description, like reference numerals refer to similar parts of the invention.

BRIEF DESCRIPTION OF THE DRAWINGS

The invention will be described with reference to the accompanying drawings which constitute part of and are incorporated by reference into the specification.

DESCRIPTION OF THE PREFERRED EMBODIMENTS

Figure 1:
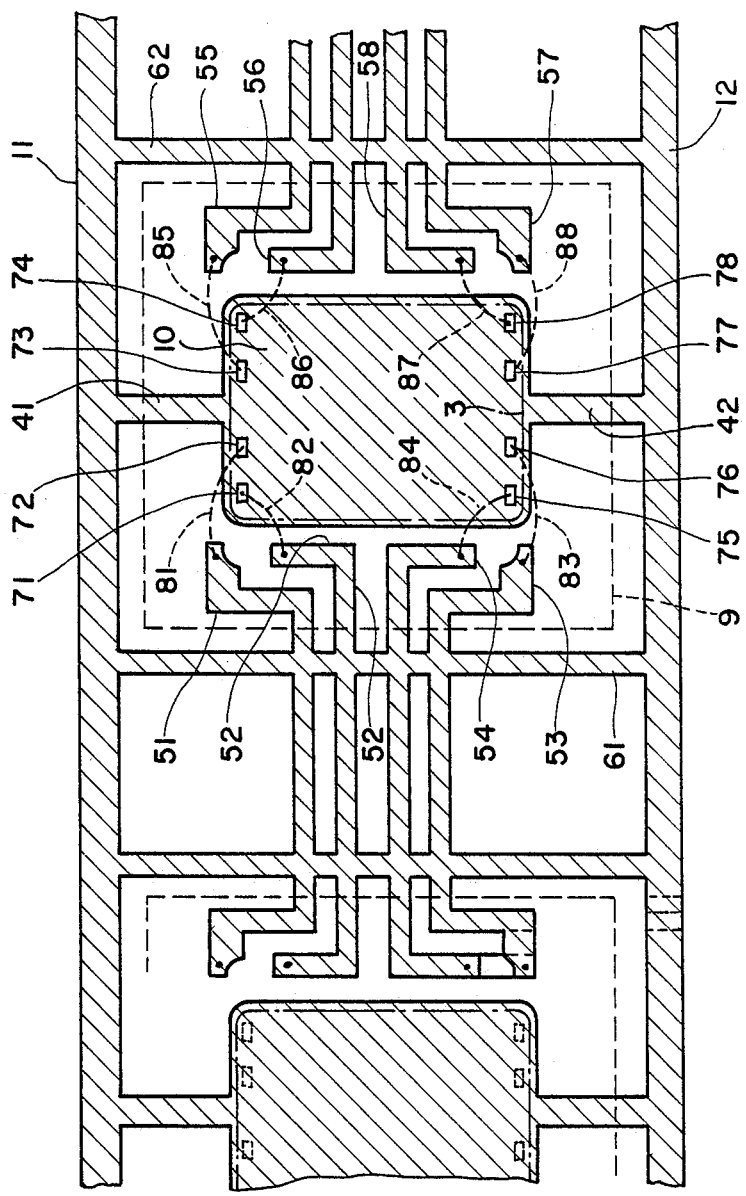
FIG. 1 is a plan view of a conventional IC lead frame.
Figure 2:
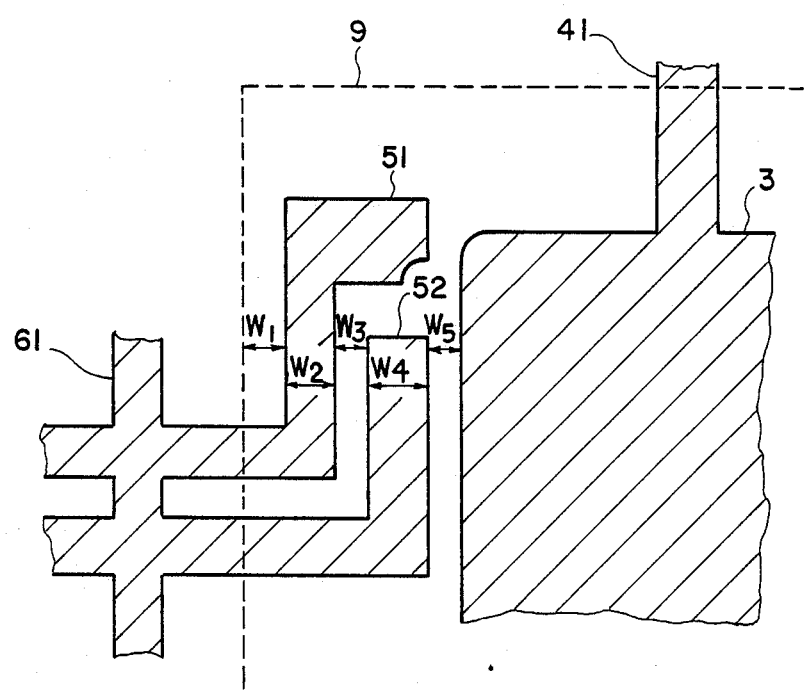
FIG. 2 is a partial plan view of the lead frame of FIG. 1.

Before discussing the details of the present invention, some details of conventional lead frames shown in FIGS. 1 and 2 are described.

FIG. 1 shows a conventional lead frame pattern together with portions of adjacent patterns. In FIG. 1, reference numerals 11 and 12 designate lateral bars. Reference numerals 61 and 62 indicate tie bars which connect the lateral bars, and together with the lateral bars form an outer frame. Reference numeral 3 designates a stage on which an IC chip is mounted. Reference numerals 41 and 42 designate stage bars which connect to each of the lateral bars 11 and 12, and hold stage 3 in position. Reference numerals 51 thru 58 designate leads. These leads are connected to each other by tie bars 61 and 62 which form a part of the outer frame and hold the leads in position with respect to the stage and the outer frame. The portion of each lead which is sealed in a molded package, indicated by broken line 9, is called an inner lead. The portion of each lead which extends out of the molded package is called an outer lead. The lead frames are connected in the form of a strip, and fabricated by punching or etching a metallic ribbon comprised of a nickel-iron alloy or a copper alloy.

An IC chip 10, designated by the shaded area is mounted on the stage 3. Bonding pads 71 thru 78 formed on the chip surface are wire bonded to the tips of respective inner leads. The bonding wires, designated by reference numerals 81 thru 88 are typically made of gold or aluminum. The structure is then sealed by molding it in a plastic material. After that, the tie bars 61 and 62, and stage bars 41 and 42 are cut away from lateral bars 11 and 12. At the same time, the outer leads which are linked to each other by the tie bars are separated and bent into a specified shape; thus completing a molded type IC.

In order to make bonding easy, the tips of the inner leads should be placed as close as possible to the respective bonding pads which are located on the chip. However, chip designs often result in bonding pads being arranged on the shorter edge of the chip, parallel to the lateral bars 11 and 12 as shown in FIG. 1. Standard packages usually require the outer leads to be positioned along a line perpendicular to the alignment of the bonding pads which are located on the chip. As a result, the pattern of the inner leads is complicated.

For example, the inner leads are often formed in a crank shape such as the inner leads 51, 53, 55 and 57, shown in FIG. 1, or in an L shape such as the inner leads 52, 54, 56 and 58. Because both the width and spacing between the inner leads have practical minimum values, as will be described later regarding FIG. 2, it is difficult to improve the packing density factor by minimizing these values.

FIG. 2 illustrates an enlarged view of the circled portion of FIG. 1. In FIG. 2, $W_1$ designates a distance between an edge of the molded case 9 and an inner lead 51. Reference letters $W_2$, $W_3$, $W_4$ and $W_5$ respectively designate the width of the inner lead 51, the spacing between the inner leads 51 and 52, width of the inner lead 52 and the spacing between the inner lead 52 and the stage 3, all measured in the same direction. The sum of $W_1+W_2+W_3+W_4+W_5$ must be minimized to improve the packing density factor. The following factors limit the amount by which each of these measurements can be reduced.

(1) $W_1$ must be large enough to provide electrical insulation and to resist the pulling force of the leads;

(2) The inner lead width, $W_2$, must be selected such that each inner lead had sufficient strength to resist wire bonding or molding process stresses without deformation of the lead;

(3) The inner lead width, $W_4$, must be large enough to permit wire bonding without deformation of the lead; and (4) The spacing distances $W_3$ and $W_5$ have lower limits defined by punching technology and the thickness of the lead frame.

Because of the above factors, the packing density factor can be improved only to a limited degree by reducing the measurements $W_1$ thru $W_5$ using conventional techniques.

The present invention provides a semiconductor device having an improved packing density factor by teaching a novel means for reducing factor (2), noted above. The means including connecting the inner leads to the tie bars with supporting bars; and minimizing the width of the inner leads to the degree possible in the fabrication technology used to make the lead frame (e.g., punching or etching).

Figure 3:
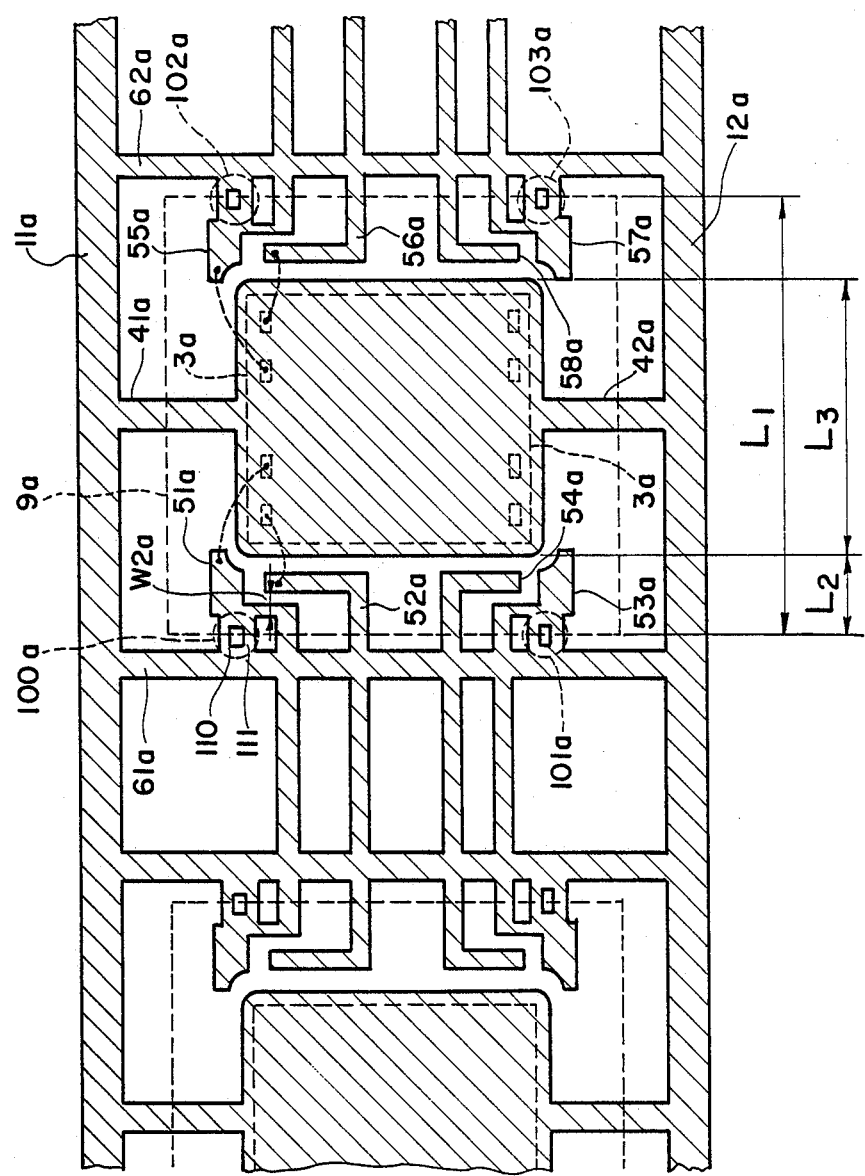
FIG. 3 is a plan view of a first embodiment of the lead frame of the present invention.

FIG. 3 illustrates a first embodiment of the lead frame pattern of the present invention. In FIG. 3, reference numerals 11a and 12a designate lateral bars, 3a designates a stage, 41a and 42a designate stage bars, 51a–58a designate inner leads, 61a and 62a designate tie bars which form a part of an outer frame holding the inner leads in position. These elements are substantially similar to elements in FIG. 1 designated with similar reference numerals. However, unlike in FIG. 1, the present invention provides supporting bars 100a, 101a, 102a and 103a, between the tip of the crank shaped inner leads 51a, 53a, 55a or 57a, and the tie bars 61a or 62a. The small broken line circles in FIG. 3 indicate the locations of these supporting bars. Illustrative of the supporting bar structure, supporting bar 100a, placed between the tip of inner lead 51a and tie bar 61a comprises two spaced apart bridges, 110 and 111 which fix the tip of inner lead 51a to tie bar 61a. The two bridges are spaced apart so that inner lead 51a appears to have two branches 110 and 111.

When mounting the chip on stage 3a, or while wire bonding to specific ones of the inner leads, and until the structure is molded in a plastic material, the supporting bars 100a, 101a, 102a and 103a tightly fix respective ones of the tips of the inner leads 51a, 53a, 55a and 57a to respective ones of the tie bars 61a and 62a. Because of this, the width, $W_2$, of the inner lead 51a at a portion parallel to the tie bar 61a, can be minimized to the degree possible in the punching technology. In the same way, the width of a similar portion of the inner leads 53a, 55a and 57a can be reduced.

So, as shown in FIG. 3, if the width of the package, $L_1$, is kept equal to that of a conventional package; that is, with the same package size it is possible to make $L_2$, the distance between the stage 3a and the edge of the package, smaller than that of the conventional frame. Therefore, $L_3$ the width of the stage 3a, can be made wider and can hold a larger chip. On the contrary, if the chip size is held equal to the size housed in the conventional package, the distance $L_1$ can be made smaller; that is, the package size can be reduced.

Thus, the packing density factor of semiconductor devices embodying the lead frame pattern of the present invention is improved. In practice, use of the lead frame pattern of the present invention improves the packing density by 20–30% compared to prior art IC devices.

In order to finish the IC, the molded device is cut away from the outer frame. in doing so, the outer leads are separated and the portions supported by supporting bars are cut away from respective supporting bars. Since after being molded, the inner leads are fixed in the molded case, there is little chance of the leads being deformed. The portion of bridges 110 and 111 that are left in the molded case reinforce the strength of and keep the tips of the inner leads in position. Though the tips of the branch portions project out slightly from the molded case, they do not degrade the sealing of the IC nor the characteristics of the IC. Next, the outer leads are bent into the desired shape. Because, this process is similar to that used to make conventional devices, there is no need to change the conventional assembly process; thus the cost of production does not change.

Figure 4:
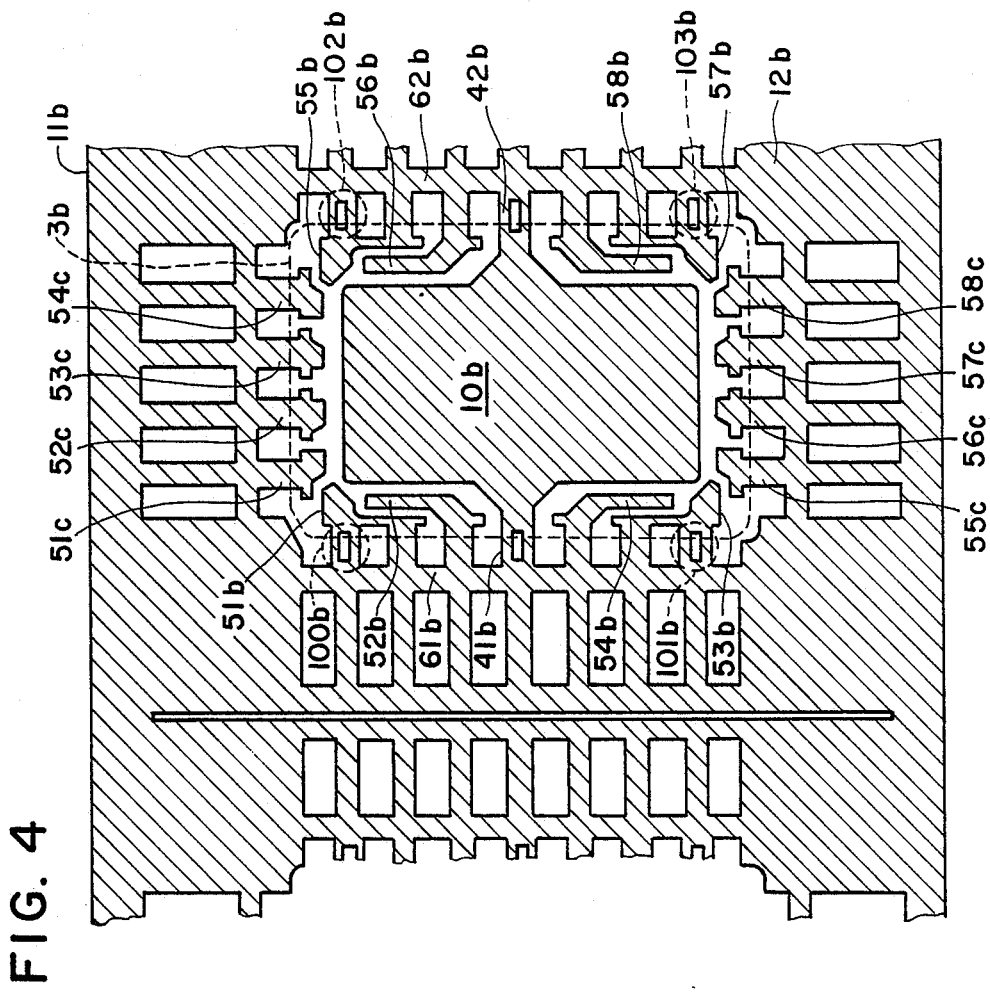
FIG. 4 is a plan view of a second embodiment of the present invention.

FIG. 4 shows a plan view of a second embodiment of the lead frame of the present invention. In FIG. 4, like reference numerals designate similar elements identified in FIGS. 1-3. In this second embodiment, stage 3b is supported by stage bars 41b and 42b, but these stage bars do not directly connect to lateral bars 11b and 12b. They are, however, fixed to tie bars 61b and 62b, and these tie bars are fixed to the lateral bars as in the first embodiment.

Unlike the first embodiment, there are additional leads, 51c thru 58c directly connected to lateral bars 11b and 12b, and connected to each other by tie bars. These leads make it possible to provide more interconnections to and from larger and more IC chips.

Another difference from the first embodiment is that the stage bars 41b and 42b comprise two bridges similar to the supporting bars 100b to 103b. However, a problem with these stage bars is that moisture normally penetrates the molded package and reaches the chip along the surface of the metal frame. Thus, because the stage bar is connected directly to the chip and not via wire bondings as are the other leads, it is desirable to minimize the width of the stage bars in order to prevent moisture from forming on the IC chip mounted on the stage 3b.

Figure 5:
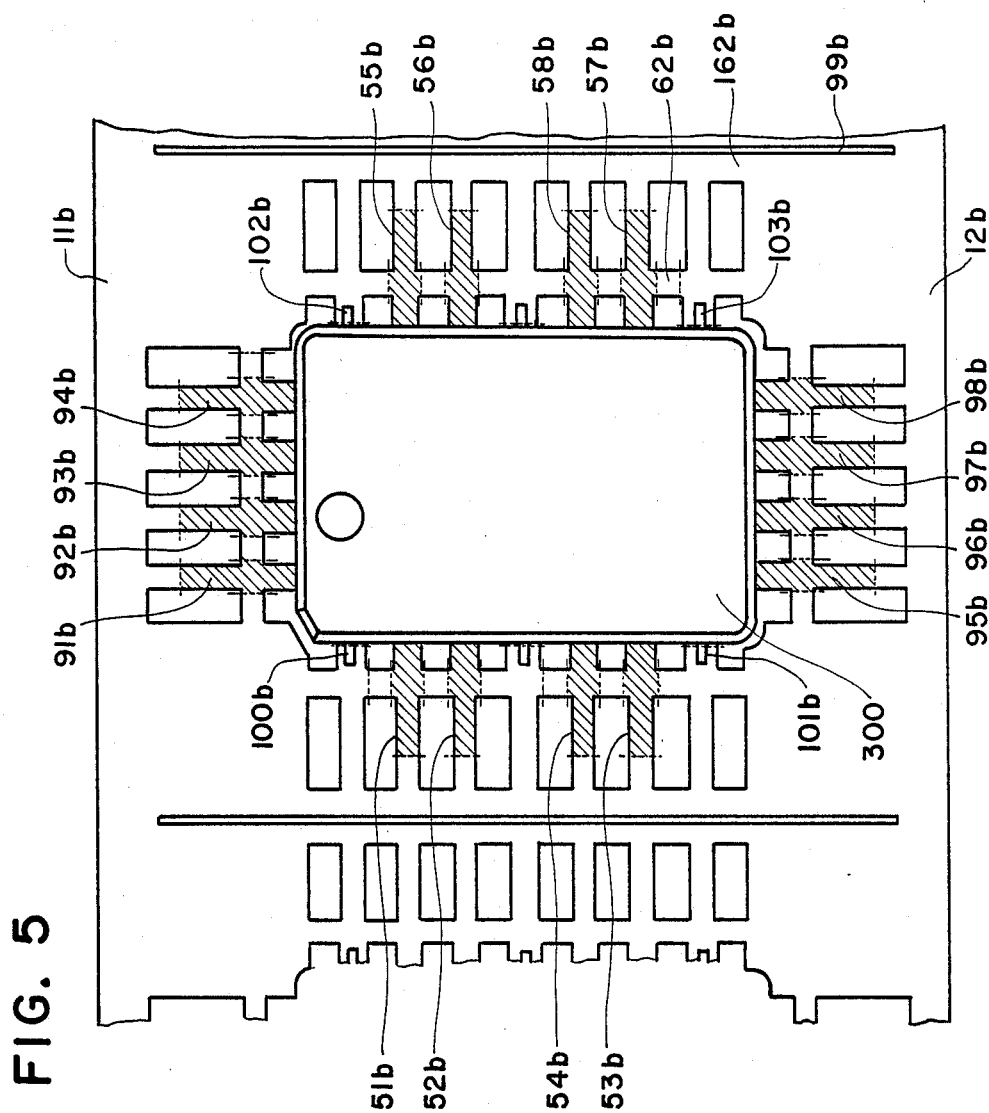
FIG. 5 illustrates an IC using the lead frame shown in FIG. 4, just after the molding production stage of the IC.

In fabricating a device employing the lead frame pattern shown in FIG. 4, a chip is mounted on the stage 3b and wire leads are bonded from respective inner leads to corresponding bonding pads on the chip. The stage 3b and the inner leads are then molded in a plastic material. FIG. 5 shows a device employing the second embodiment of the present invention just after the molding process has been completed. In this figure, the outer leads project from the plastic body 300.

After the molding process is completed, the outer leads are formed by cutting off the tie bars and supporting bars. The cutting is done along the double-dot chained lines, shown in FIG. 5 so that only the hatched portion of the leads remain. The hatched portions 51b thru 58b and 91b thru 98b comprise the outer leads which are then bent and formed into the desired shape.

Figure 6:
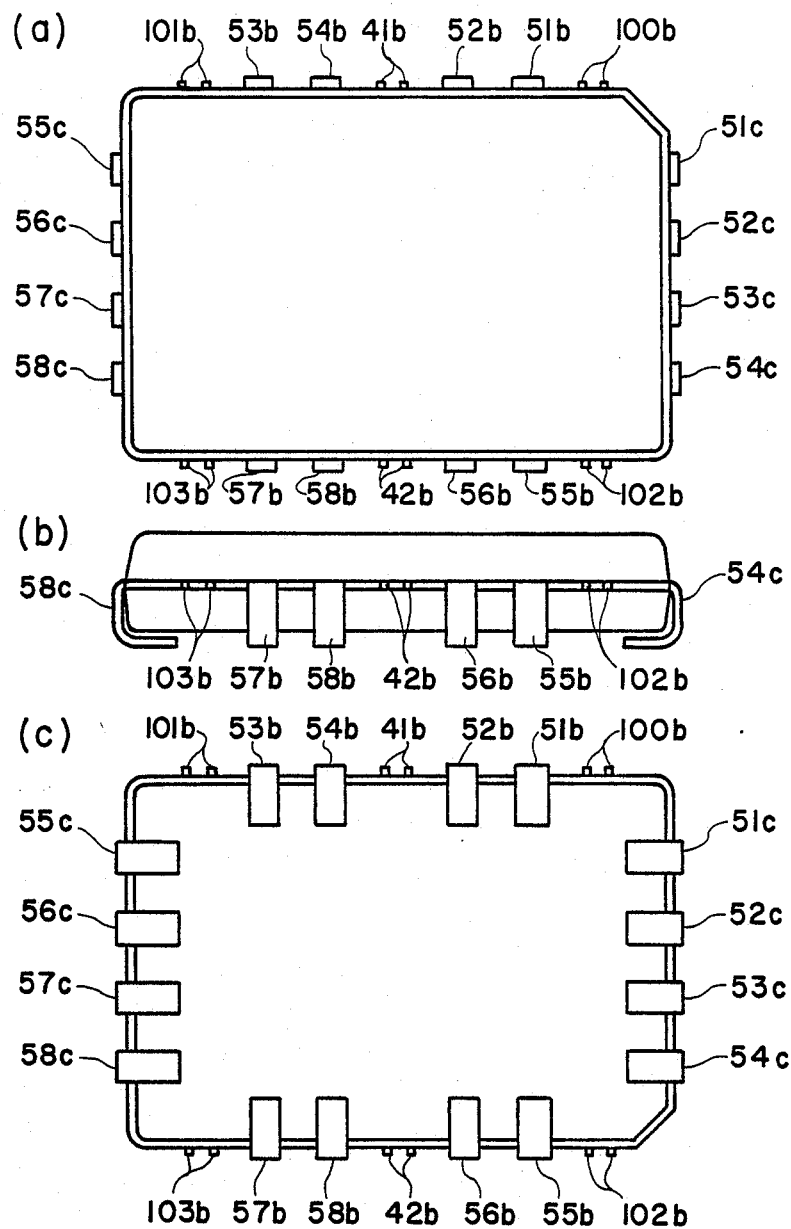
FIGS. 6(a), (b) and (c) respectively illustrate top, side and bottom views of an IC using the lead frame shown in FIG. 4, just after the outer leads have been formed.

FIG. 6 illustrates the shape of a finished IC using the lead frame shown in FIG. 4. In FIG. 6, (a) is a plan view, (b) is a side view, and (c) is a bottom view of the IC. As shown in FIG. 6, the outer leads are bent underneath the IC; thus, it is easy to solder the IC into circuits. The shape is also convenient for use with spring connectors. This type of IC is called a plastic chip carrier, and is used widely for small circuits.

As shown in FIG. 6, the tips of the supporting bars (e.g., 100b); that is, the portion of the supporting bars left in the mold case, can be seen from outside of the case. This is because it is difficult to cut the supporting bars at surface of the mold case. However, as noted above, these portions do not degrade either the seal of the IC or the characteristics of the IC.

As described above, the present invention increases the packing density of devices in circuits. Because the improvement in packing density factor is in the range of 20-30%, it is very effective when used with modern miniature circuits which must be as small as possible. It will be understood that the 20-30% increase in packing density factor permits a corresponding increase in chip size. This means that a large number of devices can be added to the chip housed in a package using the lead frame pattern of the present invention.

It should be pointed out that the present invention does not require any change or special process for production of the device. Thus, conventional processes and devices can be used in the production of ICs employing the present invention and the fabrication cost of a device embodying the present invention is no more than a conventional IC.

In the above description, the disclosure has focused on the so called plastic chip carrier type IC. But, it is clear that the invention can be applied to any other type of IC. Furthermore, it can be applied, not only to ICs but, also to any kind of semiconductor devices.

Accordingly, the present invention is not limited to the specific embodiments described herein but, is defined by the claims as follows.

What we claim is:

1. A lead frame of a single continuous sheet of material for mounting a semiconductor element comprising:
    a stage for mounting the semiconductor element;
    an outer frame positioned to frame said stage and being fixed to said stage;
    a plurality of first leads, each having an outer part positioned outside and connected to said outer frame, and having an inner part positioned between said outer frame and said stage at a first distance from said stage, each inner part of said first leads having a first portion being substantially parallel with an edge of said stage and having a first width and having a second part being substantially perpendicular to the edge of said stage and connected to said outer frame;
    a plurality of second leads, each having an outer part positioned outside and connected to said outer frame, and having an inner part positioned between said stage and said outer frame, each inner part of said second leads having a first portion being substantially parallel to the first portion of said first leads and positioned at a second distance from said stage greater than the first distance, said first portion of said second leads having a width smaller than the width of the first portion of the inner part of said first leads, and having a second part being substantially perpendicular to the edge of said stage and connected to said outer frame;
    supporting means, extending between and connected to said outer frame and each of the respective first portions of the inner part of said second leads, for supporting the respective inner parts of said second leads and holding the respective inner parts of said second leads in a fixed position.

2. A lead frame as recited in claim 1, wherein said lead frame comprises a metal.

3. A lead frame as recited in claim 2, wherein said metal comprises one of a copper alloy and a nickel-iron alloy.

4. A lead frame as recited in claim 1, wherein said outer frame comprises lateral bars and tie bars connected so as to form a rectangular frame.

5. A lead frame as recited in claim 4, further comprising a stage bar connected between said stage and one of said tie bars.

6. A lead frame as recited in claim 4, further comprising a stage bar connected between said stage and at least one of said lateral bars.

7. A lead frame as recited in claim 1, wherein said first portion of said second leads has a narrower width than the remaining portion of said inner part of said second leads.

8. A semiconductor device lead frame according to claim 1, wherein said supporting means comprises a pair of spaced apart supporting arms fixed to said frame and to the first portion of said second leads.

9. A semiconductor device lead frame according to claim 1, further comprising a pair of spaced apart supporting arms fixed to said outer frame and to said stage so as to hold said stage within said outer frame.

* * * * *